(12) United States Patent
Kim et al.

(10) Patent No.: US 9,236,304 B2
(45) Date of Patent: Jan. 12, 2016

(54) SEMICONDUCTOR LIGHT EMITTING DEVICE AND METHOD OF MANUFACTURING THE SAME

(71) Applicant: SAMSUNG ELECTRONICS CO., LTD., Suwon-si, Gyeonggi-do (KR)

(72) Inventors: Tae Hun Kim, Anyang-si (KR); Sung Joon Kim, Suwon-si (KR); Su Yeol Lee, Seongnam-si (KR); Seung Hwan Lee, Suwon-si (KR); Tae Sung Jang, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/150,713

(22) Filed: Jan. 8, 2014

(65) Prior Publication Data

US 2014/0199796 A1     Jul. 17, 2014

(30) Foreign Application Priority Data

Jan. 15, 2013 (KR) ........................ 10-2013-0004486

(51) Int. Cl.
| | | |
|---|---|---|
| *H01L 21/00* | (2006.01) | |
| *H01L 21/78* | (2006.01) | |
| *H01L 33/62* | (2010.01) | |
| *H01L 23/00* | (2006.01) | |

(Continued)

(52) U.S. Cl.
CPC ................ *H01L 21/78* (2013.01); *H01L 24/18* (2013.01); *H01L 33/62* (2013.01); *H01L 33/52* (2013.01); *H01L 33/60* (2013.01); *H01L 2224/48091* (2013.01); *H01L 2224/48247* (2013.01)

(58) Field of Classification Search
CPC .......... H01L 21/78; H01L 33/46; H01L 33/52
USPC ............ 438/22, 26–29; 257/88, 98, E33.061, 257/E33.059, E33.072
See application file for complete search history.

(56) References Cited

U.S. PATENT DOCUMENTS

| | | |
|---|---|---|
| 2008/0173884 A1 | 7/2008 | Chitnis et al. |
| 2009/0065790 A1 | 3/2009 | Chitnis et al. |

(Continued)

FOREIGN PATENT DOCUMENTS

| | | |
|---|---|---|
| JP | 2001-053099 A | 2/2001 |
| JP | 2003-273408 A | 9/2003 |

(Continued)

*Primary Examiner* — Mary Wilczewski
*Assistant Examiner* — Erik T Peterson
(74) *Attorney, Agent, or Firm* — McDermott Will & Emery LLP (57) ABSTRACT

A method of manufacturing a semiconductor light emitting device includes forming a plurality of semiconductor light emitting devices on a substrate, the semiconductor light emitting devices having at least one electrode pad formed on upper surfaces thereof; forming a conductive bump by forming a bump core on the electrode pad of each of the semiconductor light emitting devices and forming a reflective bump layer enclosing the bump core; forming a resin encapsulating part containing a phosphor on the plurality of semiconductor light emitting devices to encompass the conductive bump; polishing the resin encapsulating part to expose the bump core of the conductive bump to an upper surface of the resin encapsulating part; and forming individual semiconductor light emitting devices by cutting the resin encapsulating part between the semiconductor light emitting devices.

11 Claims, 11 Drawing Sheets

(51) Int. Cl.
*H01L 33/00* (2010.01)
*H01L 33/52* (2010.01)
*H01L 33/60* (2010.01)

(56) References Cited

U.S. PATENT DOCUMENTS

| | | | |
|---|---|---|---|
| 2009/0121241 A1 | 5/2009 | Keller et al. | |
| 2009/0286337 A1 | 11/2009 | Lee et al. | |
| 2010/0248400 A1 | 9/2010 | Kim | |
| 2011/0101520 A1* | 5/2011 | Liu et al. | 257/737 |
| 2011/0210370 A1 | 9/2011 | Kamamori et al. | |
| 2011/0260300 A1* | 10/2011 | Chu et al. | 257/632 |

FOREIGN PATENT DOCUMENTS

| | | |
|---|---|---|
| JP | 2009-231568 A | 10/2009 |
| KR | 10-2008-0083377 A | 9/2008 |
| KR | 10-2009-0115156 A | 11/2009 |
| KR | 10-2010-0093565 A | 8/2010 |
| KR | 10-2012-0048330 A | 5/2012 |
| WO | 2012/060509 A1 | 5/2012 |

* cited by examiner

SEMICONDUCTOR LIGHT EMITTING DEVICE AND METHOD OF MANUFACTURING THE SAME

CROSS-REFERENCE TO RELATED APPLICATIONS

This application claims the priority of Korean Patent Application No. 10-2013-0004486 filed on Jan. 15, 2013, in the Korean Intellectual Property Office, the disclosure of which is incorporated herein by reference.

TECHNICAL FIELD

The present application relates to a semiconductor light emitting device and a method of manufacturing the same.

BACKGROUND

A semiconductor light emitting device is a semiconductor device able to emit light of various colors due to electron-hole recombination occurring at p-n junctions between p-type and n-type semiconductors when current is applied thereto. Such a semiconductor light emitting device is advantageous over a filament-based light emitting device in that it has a relatively long lifespan, relatively low power consumption, superior initial-operating characteristics, and high vibration resistance. These factors have continually boosted the demand for semiconductor light emitting devices.

A light emitting device package using the above-mentioned semiconductor light emitting device has been manufactured by applying a mixture of a phosphor and a transparent resin to surround the light emitting device (LED chip) using a known method such as dispensing or the like. In this case, an amount of phosphor disposed on a top surface of the LED chip may be different from that disposed on lateral surfaces of the LED chip, resulting in a difference in color characteristics, such as color temperature and the like, between light emitted from the top surface of the LED chip and light emitted from the lateral surfaces of the LED chip. In addition, in a case in which the LED chip is mounted in a cup-shaped structure and the cup-shaped structure is filled with a resin, an optical path may be lengthened due to light scattering caused by phosphors, whereby light emitting efficiency may be deteriorated.

In order to address this matter, a wafer level coating method of applying a phosphor to a plurality of LED chips has been used. In this case, a plurality of LED chips are mounted on a wafer and a phosphor is applied to the wafer before optical characteristics of individual LED chips are evaluated.

In a method of manufacturing a semiconductor light emitting device using the wafer level coating method, a metallic bump is used to make electrical connection between the light emitting device and a circuit board. However, the formation of the bump generally involves a relatively complicated manufacturing process and high manufacturing costs. In addition, the metallic bump absorbs light emitted from the light emitting device, resulting in a reduction in light extraction efficiency.

SUMMARY

The present application provides a method of manufacturing a semiconductor light emitting device achieving improved light extraction efficiency by allowing light emitted from the light emitting device to be reflected without being absorbed by a bump.

The present application also provides a method of manufacturing a semiconductor light emitting device using a wafer level coating method, while simplifying a process of forming a bump.

According to an aspect of the present application, there is provided a method of manufacturing a semiconductor light emitting device, the method including: forming a plurality of semiconductor light emitting devices on a substrate, the semiconductor light emitting devices having at least one electrode pad formed on upper surfaces thereof; forming a conductive bump by forming a bump core on the electrode pad of each of the semiconductor light emitting devices and forming a reflective bump layer enclosing the bump core; forming a resin encapsulating part containing a phosphor on the plurality of semiconductor light emitting devices to encompass the conductive bump; polishing the resin encapsulating part to expose the bump core of the conductive bump to an upper surface of the resin encapsulating part; and forming individual semiconductor light emitting devices by cutting the resin encapsulating part between the semiconductor light emitting devices.

The reflective bump layer may be formed by dotting a light reflective material on the bump core in an inkjet scheme and firing the light reflective material dotted on the bump core.

The light reflective material may include silver (Ag) or aluminum (Al).

The bump core may be formed by dotting a conductive material on the electrode pad in an inkjet scheme and firing the conductive material dotted on the electrode pad.

The conductive material may be selected from the group consisting of nickel (Ni), copper (Cu), palladium (Pd), platinum (Pt) and gold (Au).

The bump core may have a height of 50 μm to 120 μm.

The forming of the resin encapsulating part may be performed by dispensing, screen printing, spin coating, spray coating or transfer molding.

The plurality of semiconductor light emitting devices may include a semiconductor epitaxial layer composed of a first conductivity type semiconductor layer, an active layer and a second conductivity type semiconductor layer sequentially stacked on the substrate, and the electrode pad electrically connected to the second conductivity type semiconductor layer.

The bump core may be formed by using metal wire balls, bonding metal balls, evaporation coating, electroplating, or screen printing.

According to another aspect of the present application, there is provided a semiconductor light emitting device including: a substrate; a semiconductor epitaxial layer including a first conductivity type semiconductor layer, an active layer and a second conductivity type semiconductor layer sequentially stacked on the substrate; at least one electrode pad provided on an upper surface of the semiconductor epitaxial layer to be electrically connected to the semiconductor epitaxial layer; and a conductive bump provided on a surface of the at least one electrode pad and including a bump core and a reflective bump layer enclosing the bump core while allowing an upper surface of the bump core to be exposed.

The semiconductor light emitting device may further include a resin encapsulating part containing a phosphor provided on the upper surface of the semiconductor epitaxial layer and having an upper surface even with the exposed upper surface of the bump core of the conductive bump.

The reflective bump layer may be formed of a light reflective material.

The light reflective material may include silver (Ag) or aluminum (Al).

The bump core may be formed by dotting a conductive material on the electrode pad in an inkjet scheme and firing the conductive material dotted on the electrode pad.

The conductive material may be selected from the group consisting of nickel (Ni), copper (Cu), palladium (Pd), platinum (Pt) and gold (Au).

According to another aspect of the present disclosure there is provided a semiconductor light emitting device comprising: a substrate; a semiconductor epitaxial layer including a first conductivity type semiconductor layer, an active layer and a second conductivity type semiconductor layer sequentially stacked on the substrate, wherein a portion of the first conductivity type semiconductor layer is exposed; an ohmic contact layer formed on the semiconductor epitaxial layer; a first electrode pad provided on an upper surface of the ohmic layer to be electrically connected to the ohmic contact layer; a second electrode pad provided on the exposed portion of the first conductivity type semiconductor layer to be electrically connected to the first conductivity type semiconductor layer; a conductive bump provided on a surface of the first electrode pad and a conductive bump provided on a surface of the second electrode pad, wherein each of the first and second electrode pads include a bump core and a reflective bump layer enclosing the bump core while allowing an upper surface of the bump core to be exposed.

BRIEF DESCRIPTION OF THE DRAWINGS

The above and other aspects, features and other advantages of the present application will be more clearly understood from the following detailed description taken in conjunction with the accompanying drawings, in which.

DETAILED DESCRIPTION OF THE EMBODIMENTS

Embodiments of the present application will now be described in detail with reference to the accompanying drawings.

The application of the application may, however, be exemplified in many different forms and should not be construed as being limited to the specific embodiments set forth herein. Rather, these embodiments are provided so that this disclosure will be thorough and complete.

In the drawings, the shapes and dimensions of elements may be exaggerated for clarity, and the same reference numerals will be used throughout to designate the same or like elements.

FIGS. 1 through 7 are views illustrating a method of manufacturing a semiconductor light emitting device according to a first embodiment of the present application.

Figure 1:
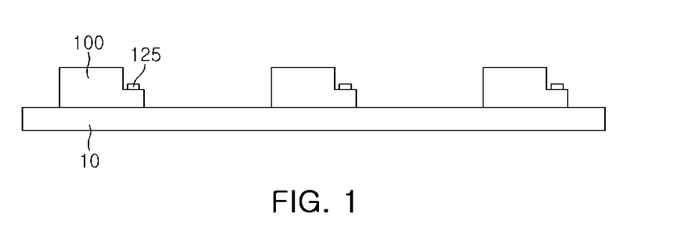
FIGS. 1 through 7 are views illustrating a method of manufacturing a semiconductor light emitting device according to a first embodiment of the present application.

With reference to FIG. 1, a plurality of semiconductor light emitting devices 100 are formed on a substrate 10 through semiconductor processing. The semiconductor light emitting devices 100 may be formed by a typical semiconductor LED formation process. The plurality of semiconductor light emitting devices 100 having at least one electrode pad formed on upper surfaces thereof are mounted on a single substrate 10. Throughout the specification, terms such as 'upper portion,' 'top surface,' 'lower portion,' 'bottom surface,' 'lateral surface' and the like are based on the accompanying drawings, and they can be changed according to arrangements of the devices.

Figure 2:
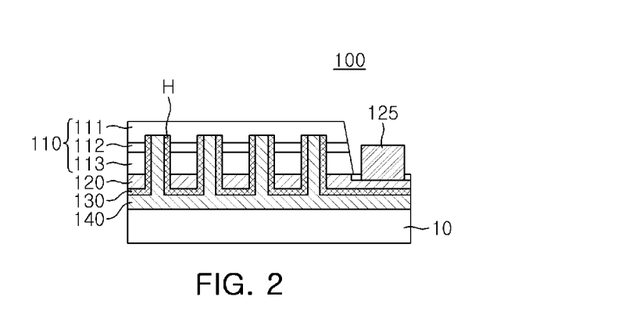

For example, the semiconductor light emitting device 100 according to a present embodiment may have a structure as illustrated in FIG. 2. That is, the semiconductor light emitting device 100 may include a semiconductor epitaxial layer 110 composed of a first conductivity type semiconductor layer 111, an active layer 112 and a second conductivity type semiconductor layer 113, a second electrode layer 120, an insulating layer 130, a first electrode layer 140, an electrode pad 125 and a conductive substrate 10. Here, the first electrode layer 140 may include one or more contact holes H extending from one surface thereof to a portion of the first conductivity type semiconductor layer 111, in order to make electrical connection with the first conductivity type semiconductor layer 111, while being electrically insulated from the second conductivity type semiconductor layer 113 and the active layer 112.

The contact hole H may extend from the first electrode layer 140 to an internal portion of the first conductivity type semiconductor layer 111 by penetrating through the second electrode layer 120, the second conductivity type semiconductor layer 113 and the active layer 112. The contact hole H may be extended to at least an interface between the active layer 112 and the first conductivity type semiconductor layer 111, and preferably to an internal portion of the first conductivity type semiconductor layer 111. Since the contact hole H is provided to make electrical connection with the first conductivity type semiconductor layer 111 and current spreading, the purpose thereof is achieved when the contact hole H contacts the first conductivity type semiconductor layer 111. Accordingly, it is not necessary for the contact hole H to extend up to an external surface of the first conductivity type semiconductor layer 111.

The second electrode layer 120 may be formed on the second conductivity type semiconductor layer 113 by sputtering, evaporation coating, or the like, and may be formed of a material selected from the group consisting of Ag, Ni, Al, Rh, Pd, Ir, Ru, Mg, Zn, Pt, and Au, in consideration of light reflectivity and ohmic contact with the second conductivity type semiconductor layer 113.

A portion of the second electrode layer 120 may be exposed outwardly. As shown in FIG. 2, the exposed portion corresponds to a region in which the semiconductor epitaxial layer 110 is not formed. The electrode pad 125 for the application of an electrical signal may be formed on the exposed portion of the second electrode layer 120.

The contact hole H may penetrate through the second electrode layer 120, the second conductivity type semiconductor layer 113 and the active layer 112 in order to be connected to the first conductivity type semiconductor layer 111. The formation of the contact hole H may be implemented using an etching process such as inductively coupled plasma reactive-ion etching (ICP-RIE) or the like.

The insulating layer 130 may be formed to cover sidewalls of the contact hole H and a surface of the second conductivity type semiconductor layer 113. In this case, the insulating layer 130 is not formed on an upper surface of the contact hole H such that the contact hole H may contact the first conductivity type semiconductor layer 111. The insulating layer 130 may be formed by evaporation coating with an insulating material such as $SiO_2$, SiOxNy, SixNy or the like.

The interior of the contact hole H may be provided with the second electrode layer 140 including a conductive via filled with a conductive material.

After providing the interior of the contact hole H with the second electrode layer 140, a substrate 10 is provided on the second electrode layer 140. In this structure, the substrate 10 may be electrically connected to the first conductivity type semiconductor layer 111 by the conductive via.

The substrate 10 may be formed of at least one selected from the group consisting of Au, Ni, Al, Cu, W, Si, Se, GaAs, SiAl, Ge, Sic, AlN, $Al_2O_3$, GaN, and AlGaN. The substrate 10 may be formed by plating, sputtering, evaporation coating, an adhesive or other suitable methods.

The number, shape and pitch of contact holes H, contact areas between the contact holes H and the first and second conductivity type semiconductor layers 111 and 113, may be appropriately adjusted in order to reduce contact resistance. In addition, the contact holes H may be variously arranged in rows and columns, so that current flow may be improved.

Various types of semiconductor light emitting devices having one or more electrode pads formed on upper surfaces thereof, besides the semiconductor light emitting devices 100 of FIG. 2, may be applied to the present embodiment.

Figure 3A:
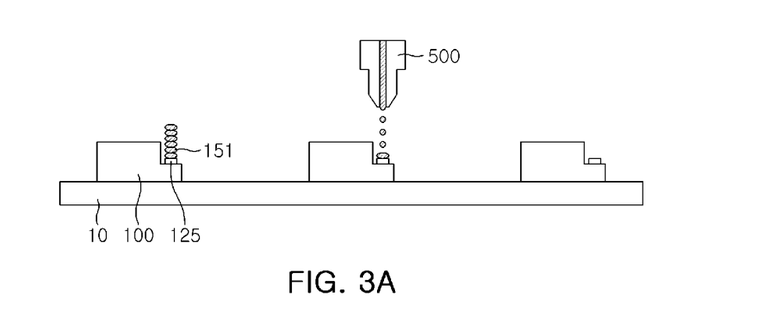
Figure 3B:
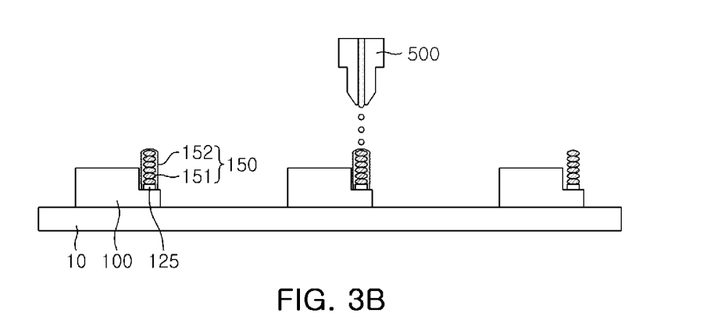

As shown in FIGS. 3A and 3B, a conductive bump 150 may be formed on the electrode pad 125 of each semiconductor light emitting device 100. Here, the conductive bump 150 may be formed using an inkjet device 500.

As shown in FIG. 3A, in order to form the conductive bump 150, a conductive bump core 151 may be formed by dotting a conductive metal material such as nickel (Ni), copper (Cu), palladium (Pd), platinum (Pt), gold (Au) or other suitable material on the electrode pad 125 using the inkjet device 500. After dotting the conductive material, it may then be fired.

The formation of the conductive bump core 151 may be implemented in consideration of a thickness of a resin encapsulating part 160 containing a phosphor to be formed later. That is, the conductive bump core 151 may be formed to have a height greater than a desired thickness of the resin encapsulating part. For example, the conductive bump core 151 may have a height of 50 μm to 120 μm.

Thereafter, as shown in FIG. 3B, a reflective bump layer 152 may be formed to enclose the conductive bump core 151 by dotting a light reflective material, for example, a high reflectivity metal such as silver (Ag), aluminum (Al), or the like, on the conductive bump core 151 using the inkjet device 500. After dotting the light reflective material, it may then be fired.

In the case of dotting the light reflective material using the inkjet device 1000 as described above, the light reflective material flows downwardly to enclose the conductive bump core 151. After firing, the reflective bump layer 152 enclosing the conductive bump core 151 may be formed.

As a result, the conductive bump 150 including the conductive bump core 151 and the reflective bump layer 152 may be obtained.

Figure 4:
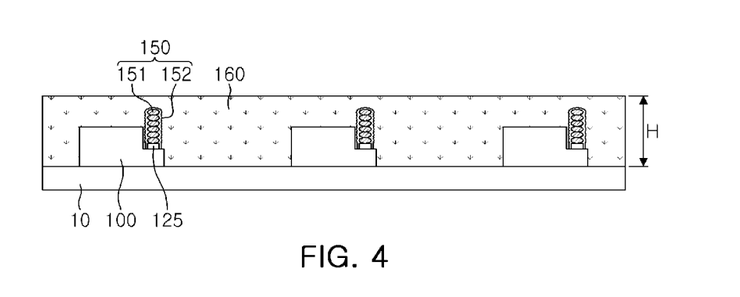

Then, as shown in FIG. 4, the resin encapsulating part 160 containing a phosphor may be formed on the plurality of semiconductor light emitting devices 100.

The resin encapsulating part 160 may be formed to have a height H sufficient to encompass the conductive bump 150.

The resin encapsulating part 160 may be formed by dispensing, screen printing, spin coating, spray coating or transfer molding.

Figure 5:
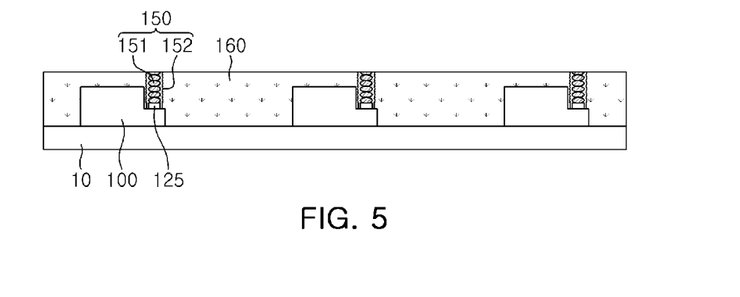

After forming the resin encapsulating part 160, as shown in FIG. 5, the resin encapsulating part 160 may be polished such that the conductive bump 150 may be exposed to an upper surface of the resin encapsulating part 160.

Therefore, a thickness of the resin encapsulating part 160 may be adjusted to be a desired thickness while having substantially the same thickness with respect to all the semiconductor light emitting devices. In addition, the conductive bump core 151 of the conductive bump 150 may be exposed to the upper surface of the resin encapsulating part 160.

Figure 6:
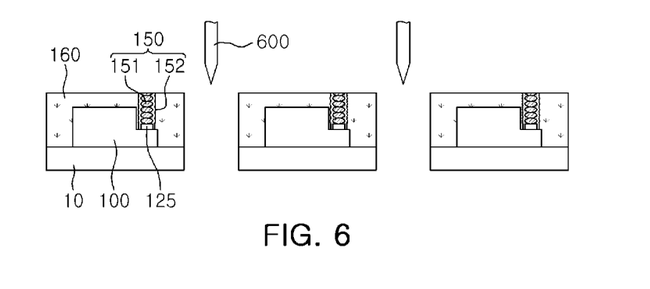

After polishing the resin encapsulating part 160, as shown in FIG. 6, the resin encapsulating part 160 may be cut between the semiconductor light emitting devices. That is, a dicing process may be performed to separate the individual semiconductor light emitting devices on the substrate from one another. In this example, the dicing process may be performed by using a dicing device 600.

Figure 7:
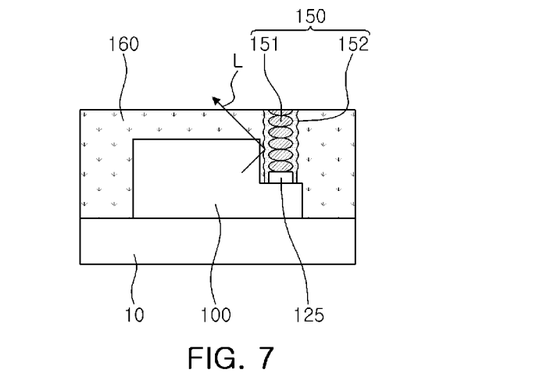

Therefore, as shown in FIG. 7, the individual semiconductor light emitting devices 100 including the conductive bump 150 composed of the conductive bump core 151 and the reflective bump layer 152 may be manufactured.

In an example in which the conductive bump 150 is composed of the conductive bump core 151 and the reflective bump layer 152 and the semiconductor light emitting device 100 is formed to include the conductive bump 150, light L emitted through lateral surfaces of the semiconductor light emitting device is reflected by the reflective bump layer 152 of the conductive bump 150, whereby light extraction efficiency may be improved. That is, the reflective bump layer 152 may prevent the light emitted from the semiconductor light emitting device from being absorbed by the conductive bump 150. In addition, an additional photo process or the like for the formation of the conductive bump 150 is not required, whereby a manufacturing process may be simplified.

FIGS. 8 through 14 are views illustrating a method of manufacturing a semiconductor light emitting device according to a second embodiment of the present application.

Figure 8:
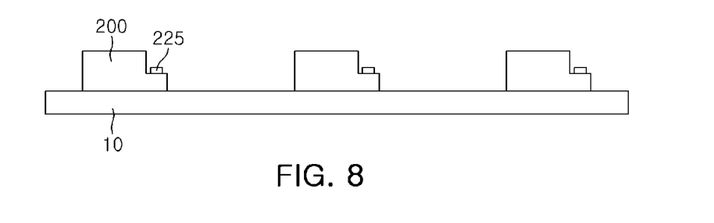
FIGS. 8 through 14 are views illustrating a method of manufacturing a semiconductor light emitting device according to a second embodiment of the present application.

With reference to FIG. 8, a plurality of semiconductor light emitting devices 200 are formed on a substrate 10 through semiconductor processing. The semiconductor light emitting devices 200 may be formed by a typical semiconductor LED formation process. The plurality of semiconductor light emitting devices 200 having at least one electrode pad 225 formed on upper surfaces thereof are mounted on a single substrate 10.

Figure 9:
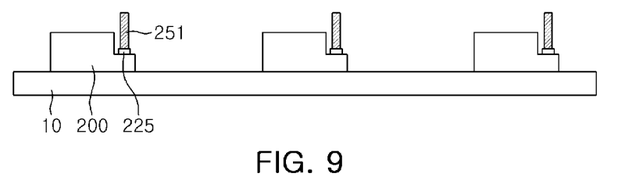
Figure 10:
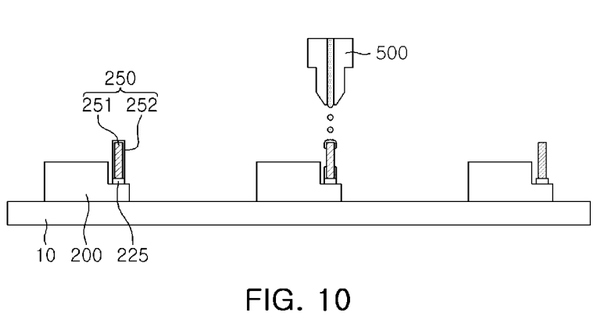

Thereafter, as shown in FIG. 9 and FIG. 10, a conductive bump 250 may be formed on the electrode pad 225 of each semiconductor light emitting device 200.

In order to form the conductive bump 250, a wire bump core 251 may be formed on the electrode pad 225 using a conductive material, for example, gold (Au).

The wire bump core 251 may be formed by using metal wire balls, bonding metal balls, evaporation coating, electroplating, screen printing or the like.

The formation of the wire bump core 251 may be implemented in consideration of a thickness of a resin encapsulating part 260 containing a phosphor to be subsequently formed. That is, the wire bump core 251 may be formed to have a height greater than a desired thickness of the resin encapsulating part 260. For example, the wire bump core 251 may have a height of 50 μm to 120 μm.

Thereafter, as shown in FIG. 10, a reflective bump layer 252 may be formed to enclose the wire bump core 251 by dotting a light reflective material, for example, a high reflectivity metal such as silver (Ag), aluminum (Al), or the like, on the wire bump core 251 using an inkjet device 500. After dotting the light reflective material, it may then be fired.

In the case of dotting the light reflective material using the inkjet device 500 as described above, the light reflective material flows downwardly to enclose the wire bump core 251. After firing, the reflective bump layer 252 enclosing the wire bump core 251 may be formed.

Therefore, the conductive bump 250 including the wire bump core 251 and the reflective bump layer 252 may be formed.

Figure 11:
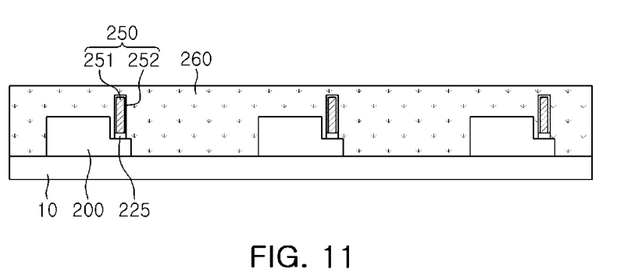

After forming the conductive bump 250, as shown in FIG. 11, the resin encapsulating part 260 containing a phosphor may be formed on the plurality of semiconductor light emitting devices 200.

The resin encapsulating part 260 may be formed to have a height H sufficient to encompass the conductive bump 250.

The resin encapsulating part 260 may be formed by dispensing, screen printing, spin coating, spray coating or transfer molding.

Figure 12:
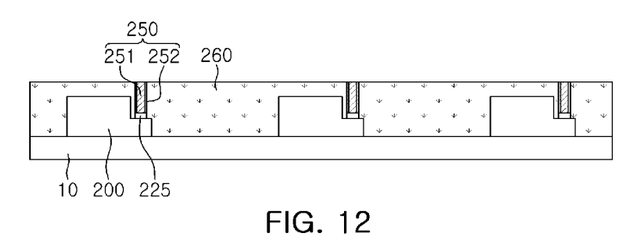

After forming the resin encapsulating part 260, as shown in FIG. 12, the resin encapsulating part 260 may be polished such that the wire bump core 251 may be exposed to an upper surface of the resin encapsulating part 260.

Therefore, a thickness of the resin encapsulating part 260 may be adjusted to have a desired thickness while all the semiconductor light emitting devices have substantially the same thickness. In addition, the wire bump core 251 may be exposed at the upper surface of the resin encapsulating part 260.

Figure 13:
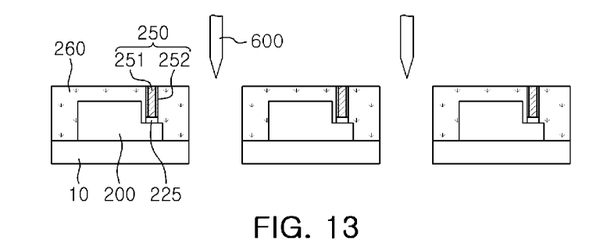

After adjusting the thickness of the resin encapsulating part 260, as shown in FIG. 13, the resin encapsulating part 260 may be cut between the semiconductor light emitting devices. That is, a dicing process may be performed to separate the individual semiconductor light emitting devices on the substrate from one another. In this case, the dicing process may be performed by using a dicing device 600.

Figure 14:
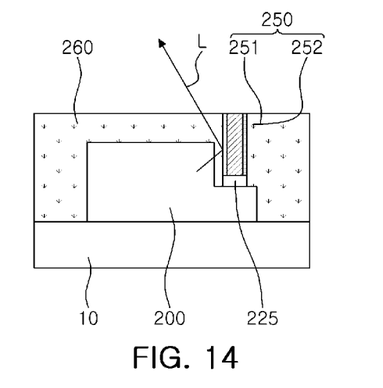

Therefore, as shown in FIG. 14, the individual semiconductor light emitting device 200 including the conductive bump 250 composed of the wire bump core 251 and the reflective bump layer 252 may be manufactured.

In the case in which the reflective bump layer 252 is formed to enclose the wire bump core 251, light L emitted through lateral surfaces of the semiconductor light emitting device is reflected by the reflective bump layer 252, whereby light extraction efficiency may be improved.

Figure 15:
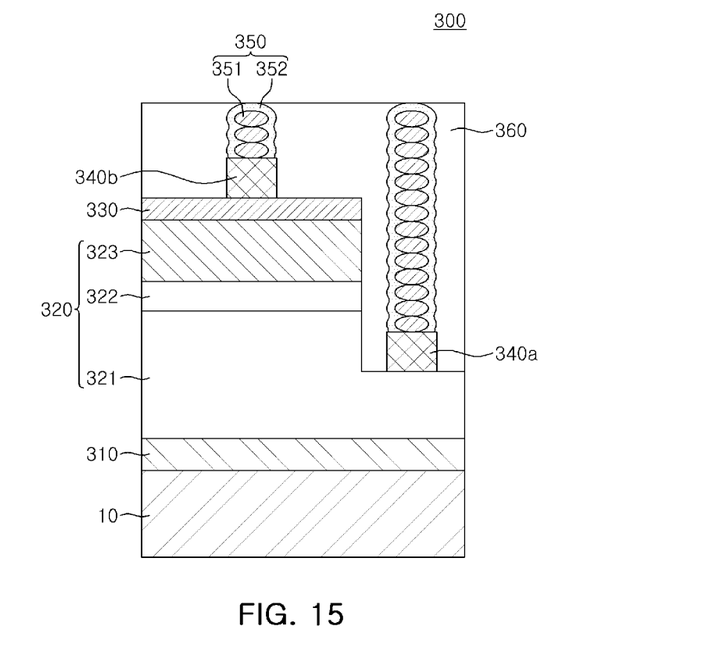
FIGS. 15 and 16 illustrate examples of a semiconductor light emitting device having a bump according to an embodiment of the present application and a package including the semiconductor light emitting device, respectively.
Figure 16:
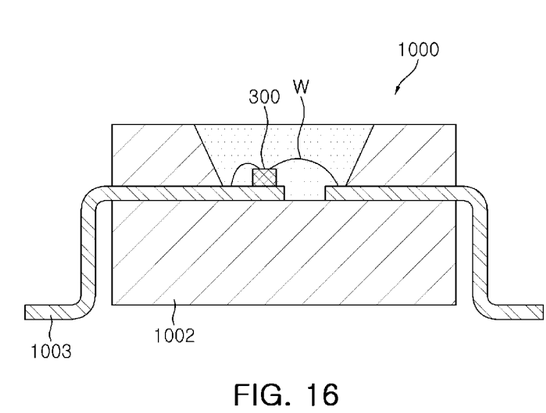

FIGS. 15 and 16 illustrate examples of a semiconductor light emitting device having a bump according to an embodiment of the present application and a package including the same, respectively.

As shown in FIG. 15, a semiconductor light emitting device 300 may include a first conductivity type semiconductor layer 321, an active layer 322 and a second conductivity type semiconductor layer 323 sequentially stacked on a substrate 10, and an ohmic contact layer 330 formed on the second conductivity type semiconductor layer 323. In addition, first and second electrodes 340a and 340b may be formed on upper surfaces of the first conductivity type semiconductor layer 321 and the ohmic contact layer 330, respectively. A conductive bump 350 composed of a conductive bump core 351 and a reflective bump layer 352 may be formed on the first and second electrodes 340a and 340b, and a resin encapsulating part 360 containing a phosphor may be formed to encompass the conductive bump 350.

The substrate 10 may be an insulating substrate, a conductive substrate or a semiconductor substrate. For example, the substrate 10 may be formed of sapphire, SiC, Si, $MgAl_2O_4$, MgO, $LiAlO_2$, $LiGaO_2$, GaN or the like. The substrate 10 may be a homogeneous substrate formed of the same material as that of the semiconductor layers. For example, the homogeneous substrate may be formed of GaN. The GaN substrate may be suitable for epitaxial growth of the semiconductor layers, but the GaN substrate involves high manufacturing costs due to difficulties in a manufacturing process thereof.

As a heterogeneous substrate, a sapphire substrate, a silicon carbide (SiC) substrate, or the like may be used. The sapphire substrate is relatively less expensive as compared to the SiC substrate, and thus, the sapphire substrate is more frequently utilized. When the heterogeneous substrate is used, a difference in lattice constants between the substrate material and the material of the semiconductor layers which form the thin film material may cause an increase in defects such as dislocations and the like. In addition, a difference in thermal expansion coefficients between the substrate material and the thin film material may cause warpage at the time of a temperature change, and the warpage may result in cracks in the semiconductor layers. This problem may be alleviated by the use of a buffer layer 310, for example, between the substrate 10 and the GaN-based semiconductor layer serving as the first conductivity type semiconductor layer 321.

A sapphire substrate may be formed of a crystal having Hexa-Rhombo Ric symmetry, and having a lattice constant of 13.001 Å in a C-axis and a lattice constant of 4.758 Å in an A-axis. Orientation planes of the sapphire substrate may include a C (0001) plane, an A (1120) plane, an R (1102) plane, and the like. In particular, the C plane is mainly used as a substrate for nitride growth as it facilitates the growth of a nitride film and is stable at high temperatures.

Meanwhile, a silicon (Si) substrate may also be appropriate to be used as the substrate 10. The use of a silicon substrate, which should have a large diameter and be relatively low in price, may facilitate mass-production. A difference in lattice constants between the Si substrate including a (111) plane as an orientation plane and GaN is approximately 17%, and a technology for suppressing the generation of crystalline defects due to the difference in lattice constants may be required. In addition, a difference in thermal expansion coefficients between the Si substrate and GaN is approximately 56%, and a technology for suppressing the generation of warpage of the substrate due to the difference in thermal expansion coefficients may be required. The warpage of the substrate may cause cracks in a GaN thin film and difficulties in the control of the formation of the GaN thin film, resulting in an increase in the distribution of wavelengths of emitted light within the same substrate.

The Si substrate absorbs light emitted from the GaN based semiconductor layer, so that external quantum efficiency of the semiconductor light emitting device may be reduced. Accordingly, as necessary, a support substrate formed of Si, Ge, SiAl, ceramic, metal, or the like, and including a reflective layer, is additionally formed after the removal of the Si substrate.

The buffer layer 310 may be formed of a material expressed by a composition of $Al_xIn_yGa_{1-x-y}N$ ($0 \le x \le 1$, $0 \le y \le 1$), in particular, GaN, AlN, AlGaN, InGaN, or InGaNAlN. As necessary, $ZrB_2$, $HfB_2$, ZrN, HfN, TiN or the like may also be used therefor. In addition, the buffer layer 310 may be formed by combining a plurality of layers or the composition thereof may be gradually varied.

The first and second conductivity type semiconductor layers 321 and 323 may be formed of semiconductors doped with n-type and p-type impurities, respectively. On the contrary, the first and second conductivity type semiconductor layers 321 and 323 may be formed of semiconductors doped with p-type and n-type impurities, respectively. For example, the first and second conductivity type semiconductor layers 321 and 323 may be formed of group III nitride semiconductors expressed by a composition of $Al_xIn_yGa_{1-x-y}N$ ($0 \leq x \leq 1$, $0 \leq y \leq 1$, $0 \leq x+y \leq 1$). The materials of the first and second conductivity type semiconductor layers 321 and 323 are not particularly limited, and AlGaInP semiconductors, AlGaAs semiconductors or the like may also be used therefor.

Meanwhile, the first and second conductivity type semiconductor layers 321 and 323 may have a single layered structure. As necessary, the first and second conductivity type semiconductor layers 321 and 323 may have a multilayer structure having different compositions, different thicknesses, and the like. For example, the first and second conductivity type semiconductor layers 321 and 323 may include a carrier injection layer capable of improving the injection efficiency of electrons and holes. In addition, the first and second conductivity type semiconductor layers 321 and 323 may have a superlattice structure.

The first conductivity type semiconductor layer 321 may further include a current diffusion layer adjacent to the active layer 322. The current diffusion layer may have a structure in which a plurality of $In_xAl_yGa_{1-x-y}N$ layers having different compositions and different contents of impurities are repeatedly laminated, or an insulating material layer is partially formed therein.

The second conductivity type semiconductor layer 323 may further include an electron blocking layer adjacent to the active layer 322. The electron blocking layer may have a structure in which a plurality of $In_xAl_yGa_{1-x-y}N$ layers having different compositions are laminated or one or more $Al_yGa_{1-y}N$ layers are laminated. Since the electron blocking layer has an energy band gap greater than that of the active layer 322, it prevents the electrons from penetrating into the second conductivity type, which may be p-type in this embodiment, semiconductor layer 323.

In addition, the active layer 322 disposed between the first and second conductivity type semiconductor layers 321 and 323 may have a multi-quantum well (MQW) structure in which quantum well layers and quantum barrier layers are alternately laminated. For example, in the case of nitride semiconductors, a GaN/InGaN structure may be used. Alternatively, the active layer 322 may have a single quantum well (SQW) structure.

The ohmic contact layer 330 may reduce ohmic contact resistance by allowing the concentration of impurities to be relatively high, thereby reducing an operating voltage of the device and improving the characteristics of the device. The ohmic contact layer 330 may be formed of GaN, InGaN, ZnO or graphene. The first and second electrodes 340a and 340b may include Ag, Ni, Al, Rh, Pd, Ir, Ru, Mg, Zn, Pt, Au or the like and may have a two or more layered structure such as Ni/Ag, Zn/Ag, Ni/Al, Zn/Al, Pd/Ag, Pd/Al, Ir/Ag, Ir/Au, Pt/Ag, Pt/Al, Ni/Ag/Pt or the like.

The conductive bump 350 composed of the conductive bump core 351 and the reflective bump layer 352 according to the first embodiment may be formed on the first and second electrodes 340a and 340b. Alternatively, the conductive bump 250 composed of the wire bump core 251 and the reflective bump layer 252 according to the second embodiment shown in FIG. 11 may be formed thereon. The resin encapsulating part 360 containing a phosphor may be formed to encompass the conductive bump 350.

The semiconductor light emitting device 300 may be applied to a semiconductor light emitting device package 1000 of FIG. 16. The semiconductor light emitting device package 1000 may include the semiconductor light emitting device 300, a package main body 1002 and a pair of lead frames 1003. The semiconductor light emitting device 300 may be mounted on the lead frame 1003 to be electrically connected thereto through a wire W. The semiconductor light emitting device 300 may be mounted on another portion of the package 1000 rather than the lead frame 1003, for example, on the package main body 1002. The package main body 1002 may have a cup shape as shown in FIG. 16 in order to improve light reflection efficiency, and such a reflective cup may be filled with a light transmissive material encapsulating the semiconductor light emitting device 300 and the wire W. The semiconductor light emitting device 300 may have the structure of FIG. 15, or the semiconductor light emitting device 300 may have different structures.

Figure 17:
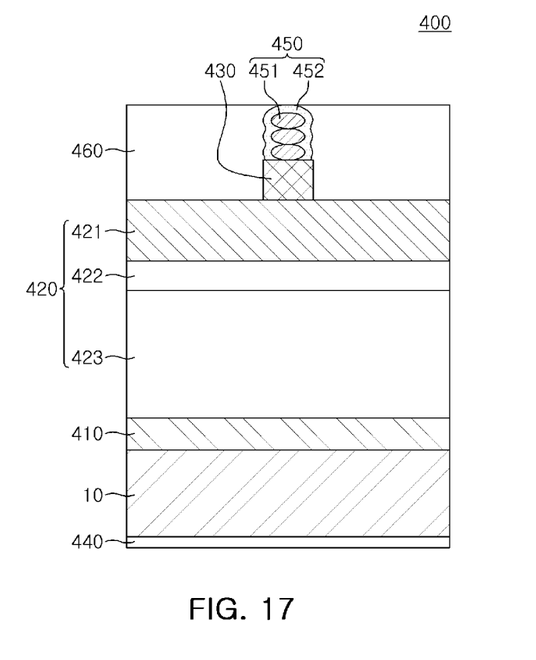
FIGS. 17 and 18 illustrate other examples of a semiconductor light emitting device having a bump according to an embodiment of the present application and a package including the semiconductor light emitting device, respectively.
Figure 18:
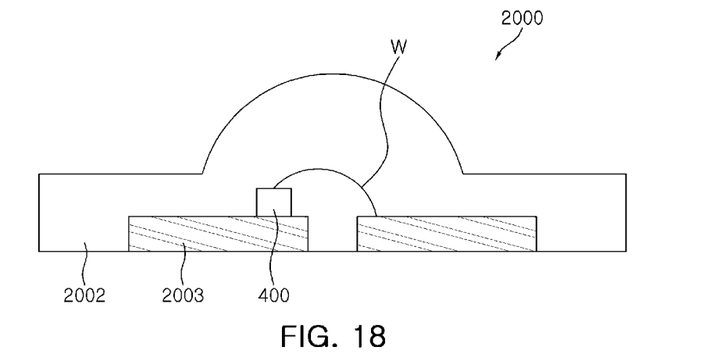

FIGS. 17 and 18 illustrate other examples of a semiconductor light emitting device having a bump according to an embodiment of the present application and a package including the same, respectively.

As shown in FIG. 17, a semiconductor light emitting device 400 may include a conductive substrate 10, a first conductivity type semiconductor layer 421, an active layer 422, a second conductivity type semiconductor layer 423, a first electrode 430 formed on the first conductivity type semiconductor layer 421, a second bonding electrode 440 formed on a bottom surface of the conductive substrate 10. The first conductivity type semiconductor layer 421, the active layer 422 and the second conductivity type semiconductor layer 423 may form a light emitting structure 420, and may be formed of group III-V semiconductors, for example, group III nitride semiconductors expressed by $Al_xGa_yIn_{1-x-y}N$ ($0 \leq x \leq 1$, $0 \leq y \leq 1$, $0 \leq x+y \leq 1$).

The conductive substrate 10 may be a metallic substrate or a semiconductor substrate. The conductive substrate 10 may be formed of at least one selected from the group consisting of Au, Ni, Al, Cu, W, Si, Se, and GaAs. For example, the conductive substrate 10 may be formed of Cu alone, or may be formed of a combination of Si and Al. The conductive substrate 10 may be a support substrate bonded after the removal of a sapphire substrate used as a growth substrate.

For example, the first electrode 430 may be formed of Ti/Al, Cr/Au or the like. The first electrode 430 may be in ohmic-contact with the first conductivity type semiconductor layer 421.

The second bonding electrode 440 may be formed on the surface of the conductive substrate 10 opposite the light emitting structure 420, and may serve as an electrode electrically connected to the second conductivity type semiconductor layer 423.

A conductive bump 450 composed of a conductive bump core 451 and a reflective bump layer 452 similar to that described in the first embodiment may be formed on the first electrode 430. Alternatively, a conductive bump 250 composed of a wire bump core 251 and a reflective bump layer 252 similar to that described in the second embodiment may be formed thereon. In addition, a resin encapsulating part 460 containing a phosphor may be formed to encompass the conductive bump 450.

A semiconductor light emitting device package 2000 of FIG. 18 is similar to the above-mentioned package 1000, in that the semiconductor light emitting device 400 is mounted on a pair of lead frames 2003 while making electrical connection therebetween using a wire W. On the other hand, the package 2000 is different from the package 1000, in that a bottom surface of the lead frame 2003 is exposed outwardly to improve the dissipation of heat and the shape of the package 2000 is maintained by a light transmissive main body 2002 encapsulating the semiconductor light emitting device 400, the wire W and the lead frame 2003. The semiconductor light emitting device 400 may have the above-described structure of FIG. 17.

The semiconductor light emitting device having the bump according to the present embodiment may be used as an LED light source in various electronic devices.

Figure 19:
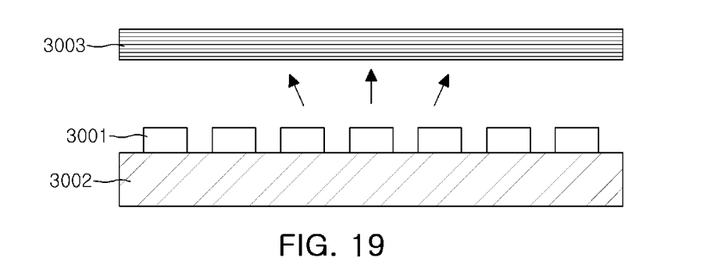
FIGS. 19 and 20 illustrate examples of applying a semiconductor light emitting device according to an embodiment of the present application to backlights.
Figure 20:
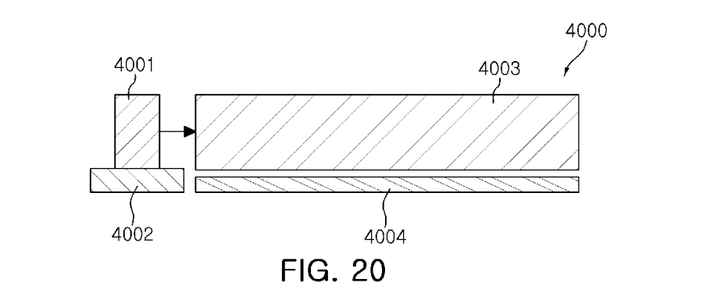

FIGS. 19 and 20 illustrate examples of applying a semiconductor light emitting device according to an embodiment of the present application to backlights. With reference to FIG. 19, a backlight 3000 includes a light source 3001 mounted on a substrate 3002 and at least one optical sheet 3003 disposed thereabove. The semiconductor light emitting device according to an embodiment of the present application may be used as the light source 3001. The light source 3001 in the backlight 3000 of FIG. 19 may emit light toward a liquid crystal display (LCD) device disposed thereabove, whereas a light source 4001 mounted on a substrate 4002 in a backlight 4000 of FIG. 20 may emit light laterally and the light is incident to a light guide plate 4003 such that the backlight 4000 may serve as a surface light source. The light travelling to the light guide plate 4003 may be emitted upwardly and a reflective layer 4004 may be formed under a bottom surface of the light guide plate 4003 in order to improve light extraction efficiency.

Figure 21:
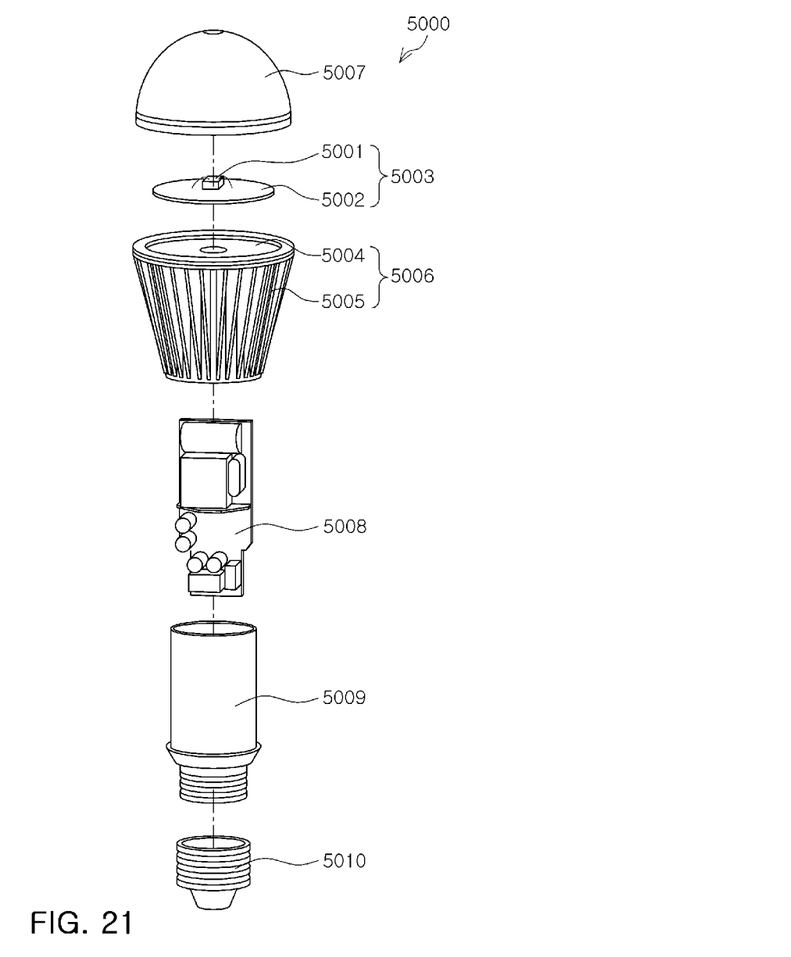
FIG. 21 illustrates an example of applying a semiconductor light emitting device according to an embodiment of the present application to a lighting device.

FIG. 21 illustrates an example of applying a semiconductor light emitting device according to an embodiment of the present application to a lighting device. With reference to an exploded perspective view of FIG. 21, a lighting device 5000 is exemplified as a bulb-type lamp, and includes a light emitting module 5003, a driver 5008 and an external connector 5010. In addition, exterior structures such as an external housing 5006, an internal housing 5009, a cover 5007 and the like may be additionally included. The light emitting module 5003 may include a semiconductor light emitting device 5001 and a circuit board 5002 having the semiconductor light emitting device 5001 mounted thereon. In the present embodiment, a single semiconductor light emitting device 5001 is mounted on the circuit board 5002, however, a plurality of semiconductor light emitting devices may be mounted thereon. In addition, the semiconductor light emitting device 5001 may be formed as a package and then mounted on the circuit board 5002, rather than being directly mounted thereon.

In the lighting device 5000, the light emitting module 5003 may include the external housing 5006 serving as a heat radiating part, and the external housing 5006 may include a heat sink plate 5004 in direct contact with the light emitting module 5003 to thereby improve the dissipation of heat. In addition, the lighting device 5000 may include the cover 5007 disposed above the light emitting module 5003 and having a convex lens shape. The driver 5008 may be disposed inside the internal housing 5009 and connected to the external connector 5010 such as a socket structure to receive power from an external power source. In addition, the driver 5008 may convert the received power into power appropriate for driving the semiconductor light emitting device 5001 of the light emitting module 5003 and supply the converted power thereto. For example, the driver 5008 may be provided as an AC-DC converter, a rectifying circuit part, or the like.

Figure 22:
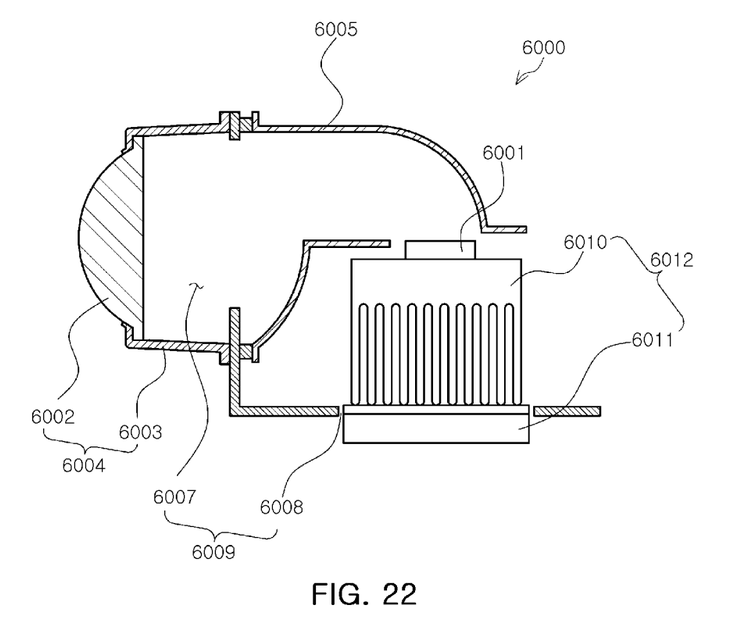
FIG. 22 illustrates an example of applying a semiconductor light emitting device according to an embodiment of the present application to a headlamp.

FIG. 22 illustrates an example of applying a semiconductor light emitting device according to an embodiment of the present application to a headlamp. With reference to FIG. 22, a headlamp 6000 used in a vehicle or the like may include a light source 6001, a reflector 6005 and a lens cover 6004, the lens cover 6004 including a hollow guide part 6003 and a lens 6002. In addition, the headlamp 6000 may further include a heat radiator 6012 dissipating heat generated by the light source 6001 outwardly. The heat radiator 6012 may include a heat sink 6010 and a cooling fan 6011 in order to effectively dissipate heat. In addition, the headlamp 6000 may further include a housing 6009 allowing the heat radiator 6012 and the reflector 6005 to be fixed thereto and supporting them. One surface of the housing 6009 may be provided with a central hole 6008 into which the heat radiator 6012 is inserted to be coupled thereto. In addition, the other surface of the housing 6009 bent in a direction perpendicular to one surface of the housing 6009 may be provided with a forwardly open hole 6007 such that light generated by the light source 6001 may be reflected by the reflector 6005 disposed above the light source 6001, pass through the forwardly open hole 6007, and be emitted outwardly.

As set forth above, according to embodiments of the disclosure, a semiconductor light emitting device can have improved light extraction efficiency by allowing light emitted from the light emitting device to be reflected without being absorbed by a bump. In addition, a separate photo process for the formation of the bump or the like is not required, so that a manufacturing process can be simplified.

While the present application has been shown and described in connection with the embodiments, it will be apparent to those skilled in the art that modifications and variations can be made without departing from the spirit and scope of the application as defined by the appended claims.

What is claimed is:

1. A method of manufacturing a semiconductor light emitting device, the method comprising:
    forming a plurality of semiconductor light emitting devices on a substrate, the semiconductor light emitting devices having at least one electrode pad formed on upper surfaces thereof;
    forming a conductive bump by forming a bump core on the electrode pad of each of the semiconductor light emitting devices and forming a reflective bump layer enclosing the bump core;
    forming a resin encapsulating part containing a phosphor on the plurality of semiconductor light emitting devices to encompass the conductive bump;
    polishing the resin encapsulating part to expose the bump core of the conductive bump to an upper surface of the resin encapsulating part; and
    forming individual semiconductor light emitting devices by cutting the resin encapsulating part between the semiconductor light emitting devices,
    wherein the reflective bump layer is formed by dotting a light reflective material on the bump core in an inkjet scheme and firing the light reflective material dotted on the bump core.

2. The method of claim 1, wherein the light reflective material includes silver (Ag) or aluminum (Al).

3. The method of claim 1, wherein the bump core has a height of 50 μm to 120 μm.

4. The method of claim 1, wherein the forming of the resin encapsulating part is performed by dispensing, screen printing, spin coating, spray coating or transfer molding.

5. The method of claim 1, wherein the plurality of semiconductor light emitting devices include a semiconductor epitaxial layer composed of a first conductivity type semiconductor layer, an active layer and a second conductivity type semiconductor layer sequentially stacked on the substrate, and the electrode pad electrically connected to the second conductivity type semiconductor layer.

6. The method of claim 1, wherein the bump core is formed by using metal wire balls, bonding metal balls, evaporation coating, electroplating, or screen printing.

7. The method of claim 1, wherein the conductive bump is disposed parallel to a side surface of at least one of the light emitting devices.

8. A method of manufacturing a semiconductor light emitting device, the method comprising:
   forming a plurality of semiconductor light emitting devices on a substrate, the semiconductor light emitting devices having at least one electrode pad formed on upper surfaces thereof;
   forming a conductive bump by forming a bump core on the electrode pad of each of the semiconductor light emitting devices and forming a reflective bump layer enclosing the bump core;
   forming a resin encapsulating part containing a phosphor on the plurality of semiconductor light emitting devices to encompass the conductive bump;
   polishing the resin encapsulating part to expose the bump core of the conductive bump to an upper surface of the resin encapsulating part; and
   forming individual semiconductor light emitting devices by cutting the resin encapsulating part between the semiconductor light emitting devices,
   wherein the bump core is formed by dotting a conductive material on the electrode pad in an inkjet scheme and firing the conductive material dotted on the electrode pad.

9. The method of claim 8, wherein the conductive material is selected from the group consisting of nickel (Ni), copper (Cu), palladium (Pd), platinum (Pt) and gold (Au).

10. A method of manufacturing a semiconductor light emitting device, the method comprising:
    forming a plurality of semiconductor light emitting devices on a substrate, the semiconductor light emitting devices having at least one electrode pad formed on upper surfaces thereof;
    forming a conductive bump by forming a bump core on the electrode pad of each of the semiconductor light emitting devices, firing the bump core formed on the electrode pad of each of the semiconductor light emitting devices prior to forming a reflective bump layer enclosing the bump core, and forming the reflective bump layer of a different material than the bump core and enclosing the bump core so as to cover all exposed surfaces of the bump core;
    forming a resin encapsulating part containing a phosphor on the plurality of semiconductor light emitting devices to encompass the conductive bump;
    polishing the resin encapsulating part to expose the bump core of the conductive bump to an upper surface of the resin encapsulating part;
    forming individual semiconductor light emitting devices by cutting the resin encapsulating part between the semiconductor light emitting devices.

11. The method of claim 10, wherein the reflective bump layer is formed of silver (Ag) or aluminum (Al).

* * * * *